United States Patent [19]

Berkenblit et al.

[11] 4,187,140
[45] Feb. 5, 1980

[54] METHOD FOR ETCHING SILICON AND A RESIDUE AND OXIDATION RESISTANT ETCHANT THEREFOR

[75] Inventors: Melvin Berkenblit; Arnold Reisman, both of Yorktown Heights, N.Y.

[73] Assignee: International Business Machines Corporation, Armonk, N.Y.

[21] Appl. No.: 950,340

[22] Filed: Oct. 11, 1978

[51] Int. Cl.$^2$ .................................................. C09K 13/00
[52] U.S. Cl. ........................................ 156/662; 156/644; 156/647; 252/79.1
[58] Field of Search ............... 156/644, 647, 657, 662; 252/79.1; 134/2; 346/140 R

[56] References Cited

U.S. PATENT DOCUMENTS

| | | | |
|---|---|---|---|
| 4,007,464 | 2/1977 | Bassous et al. | 340/146 R |
| 4,113,551 | 9/1979 | Bassous et al. | 156/662 |
| 4,155,866 | 5/1979 | Berkenblit et al. | 156/662 |

OTHER PUBLICATIONS

Bassous, "Controlled ... Silicon", IBM Technical Disclosure Bulletin, vol. 19, No. 9, (Feb. 77), p. 3623.
Finne et al., "A Water–Amine ... Silicon", J. Electrochemical Society, vol. 114, No. 9, (1967), pp. 965–969.
Bohg, "Ethylene Diamine ... Silicon", J. Electrochemical Society, vol. 118, No. 2, pp. 401–403, (2/77).

Primary Examiner—Jerome W. Massie
Attorney, Agent, or Firm—Hansel L. McGee

[57] ABSTRACT

There are provided quaternary etchants comprising ethylenediamine, pyrocatechol, water and a diazine as catalyst for the etching of polycrystalline or single crystal silicon over a wide temperature and etch rate range. The etchants provide residue free dissolution, and have etch rates which are essentially unchanged when exposed to oxygen. The etch rate of the etchants can be modulated by the change in concentrations of water and/or pyrocatechol.

There is also provided a method for etching polycrystalline or single crystal silicon using the etchants of this invention.

21 Claims, 3 Drawing Figures

METHOD FOR ETCHING SILICON AND A RESIDUE AND OXIDATION RESISTANT ETCHANT THEREFOR

DESCRIPTION

Background of the Invention

This invention relates to an improved chemical etching system for silicon. More specifically it is directed to the presence of a diazine, in excess of the molar equivalent of 5 g pyrazine/liter of ethylene diamine in a quaternary etching system also containing ethylene diamine, water and pyrocatechol.

It is well known in the art to etch silicon with an etchant comprising water, an amine and pyrocatechol. This mixture is particularly useful in that it etches anisotropically. The publication to R. M. Finne and D. L. Klein entitled "A Water-Amine Complexing Agent System for Etching Silicon," J. Electrochem. Soc. 114, 965, (1967), discloses a study on the etching abilities of ternary mixtures of water, amine and a complexing agent. The authors found the system to be a good anisotropic etchant for silicon. The water-amine-pyrocatechol etchant as indicated in the publication Industrial Research, p. 17, August 1977 has been shown to be useful in the etching of v-shaped grooves in silicon wafers sliced at certain angles to their crystalline orientations. This etchant is particularly suitable to form tapered mesas in semiconductor devices and for shaped silicon nozzles for use in ink jet printing assemblies (U.S. Pat. No. 4,007,464, Feb. 8, 1977 to E. Bassous, L. Kuhn, A. Reisman and H. Taub). The ability to reproducibly fabricate these assemblies requires constant control over the composition of the etching bath. For example it is of extreme important to control the etch rate of the bath, so that the geometries of the microstructures to be etched can be held reproducibly to desired tolerances.

Similarly it is important that the etch rate and therefore the composition of the bath be duplicated from batch to batch of fresh etchant.

In copending application Ser. No. 899,051 filed Apr. 24, 1978, now U.S. Pat. No. 4,155,866, having a common assignee, it had been observed that silicon etching rates exhibited an unexplained etch rate dependency on different lots of the amine, i.e. ethylene diamine. Similarly ethylene diamine purchased from different vendors showed wide variations of etch rates, even though like amounts of the amine were used in each bath. Such variations could not be tolerated if uniform fabrication of devices is to be obtained.

The invention in the above-mentioned application overcame the uncertainties exhibited by prior art ternary etchants, by a method of controlling the etching rates of a given etchant mixture. By controlling the amounts of specific diazines present in the etchant it was possible to maintain constancy of performance of the etchants, from one batch to another. This was accomplished by the addition of diazines to different lots of ethylene diamine to ensure that all lots have an equivalent amount of the diazine.

Furthermore, within the defined range of diazine concentrations one can alter etch rate without having to alter temperature, since these compounds in small quantities function as catalysts. The degree of catalysis and therefore etch rate is dependent on the catalyst concentration.

Because incoming lots of ethylenediamine may or may not contain traces of diazine they can be examined with UV spectrophotometry to determine the level of diazine present. The use of UV spectrophotometry coupled with etch rate calibration curves permits one to closely monitor the concentration of diazine in the ethylenediamine.

In the U.S. Pat. No. 4,155,866 it was demonstrated that etch rate can be controlled by the addition of specified amounts of diazine or its derivatives. Above these specified amounts of diazines for the given concentrations of the other components used therein an unwanted residue formed on the substrate being etched. Further, etching had to be conducted in the temperature range of about 100° C. to about 119° C. and the solution is known to be oxygen sensitive.

SUMMARY OF THE INVENTION

What has been discovered here is that modification of the concentrations of the components of the etchant permits the addition of diazine or its derivatives in excess of the molar equivalent of 5 g pyrazine/liter of ethylenediamine. These improved concentrations provide residue free surfaces, constancy of etch rates which are relatively insensitive to oxygen degradation and in which etching can be accomplished at temperatures ranging from about 20° C. to about 119° C. Two etching solutions are formulated, one having a slow etch rate (S) and a second having a fast etch rate (F). The former is useful for etching in the temperature range of from about 20° C. to about 119° C. and the latter is useful for etching in the temperature range of from about 100° C. to about 119° C.

More specifically the invention can be more succinctly stated as:

A method of etching polycrystalline and single crystal silicon with an oxygen resistant and residue free etchant including the steps of (a) preparing a residue free and oxygen resistant etch solution comprising ethylene diamine (E) in the amounts of from about 700 ml to about 800 ml, pyrocatechol (P) in the amount from about 110 grams to about 130 grams, water (W) in the amount of about 40 ml to about 100 ml and a diazine in the amount of about the molar equivalent of 5 g pyrazine/l E to about 10 g pyrazine/l E, and (b) applying said etch solution to said silicon at a temperature in the range of from about 20° C. to about 119° C. and for a time sufficient to effect the desired etch pattern.

In the alternative the invention can also be described as a residue free and oxygen resistant etch solution comprising E in the amount of from about 700 ml to about 800 ml, P in the amount of about 110 grams to about 130 grams, W in the amount of about 40 ml to about 100 ml and a diazine in the amount of about the molar equivalent of 5 g pyrazine/l E to about 10 g pyrazine/l E.

Additionally, there is also provided another residue free and oxygen resistant etch solution comprising E in the amounts of from about 700 ml to about 800 ml, P in the amount of from about 200 g to about 250 g, W in the amount of from about 200 ml to about 250 ml and a diazine in the amount of about the molar equivalent of 5 g pyrazine/lE to about 10 g pyrazine/lE.

Also provided is a method of etching polycrystalline and single crystal silicon using the above etch solution and etching at a temperature in the range of about 100° C. to about 119° C.

It is therefore an object of this invention to provide an improved method for etching silicon which is residue free and where the etchant is oxygen resistant.

It is a further object of the invention to provide etch solutions capable of providing slow or fast rates of etching silicon which are oxygen stabilized and which do not leave a residue on the surface of the etched silicon surface.

It is yet another object of the invention to provide a method of etching silicon and an etchant therefore operable in the temperature range of from about 20° C. to about 119° C.

BRIEF DESCRIPTION OF THE DRAWINGS

The above features and advantages of the present invention will become apparent upon consideration of the following detailed description of specific embodiments thereof especially when taken in conjunction with the accompanying drawings, wherein.

DESCRIPTION OF THE PREFERRED EMBODIMENT

Figure 1:
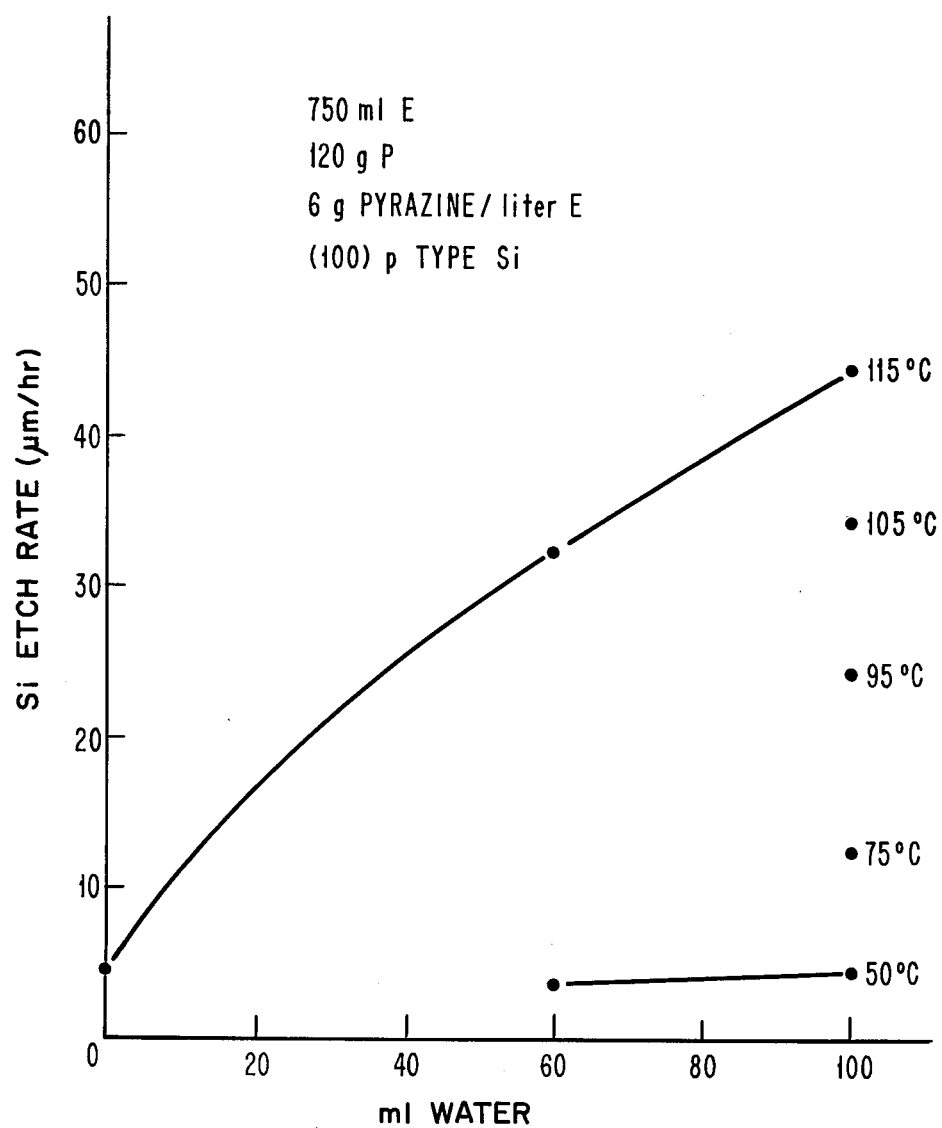
FIG. 1 depicts the variation of etch rate of (100) surfaces as a function of water content in the slow etching (S) baths of this invention at different temperatures.

Subsequent to the discovery of the effects of diazine and its derivatives on the etch rate of the ternary ethylene diamine-pyrocatechol-water (EPW) etching solutions, it was desirous to obtain quaternary EPW solutions containing a diazine or its derivative which were residue free and oxygen resistant. It was initially observed that with increased amounts of the diazine, above molar amounts equivalent to 4–5 grams pyrazine/liter of ethylene diamine there was a tendency for a residue to form on the etched silicon surface. It was later observed that with increasing amounts of the diazine the etchant became more oxygen resistant. That is, the etchant could be exposed to air without significant change in the etch rate.

Subsequent experimentation led to the discovery that by increasing the concentration of the pyrocatechol while at the same time increasing the amount of about the molar of the diazine molar equivalent to from less than 4 g pyrazine/l E to from about 5 to about 10 g pyrazine/l E, it was possible to obtain an etchant which was rapid and which was both residue free and oxygen insensitive in the temperature range of from 100° C. to about 119° C. (F etch). For example, in the following table, there is shown the effect of the concentration 1, 4 diazine (pyrazine) g/l E upon the etch rate when exposed to oxygen. Oxygen was bubbled into the etch solution at a rate of 50 scm³/min at a constant temperature of 115° C. It is seen that under conditions where the 1, 4 diazine free solution shows a 27% increase in etch rate with oxygen exposures for one hour, the etch rates of solution containing 1, 4 diazine in the amount of 6 g/l E are essentially the same following this rather severe oxygen exposure.

TABLE

| Pyrazine Concen. g/liter E | Etching Temp. °C. | Oxygen Exposure Time Hours | Etch Rate μm/hr |
|---|---|---|---|
| 0 | 115 | 0 | 27 |
| 0 | 115 | 1 | 34 |
| 2 | 115 | 0 | 68 |
| 2 | 115 | 1 | 70 |
| 6 (F Etch) | 115 | 0 | 81 |
| 6 | 115 | 1 | 81 |

As a result of the above experimentation and observations, it has been discovered that a fast ("F") etch solution which is both oxygen and residue resistant can be prepared from a mixture comprising from about 700 ml to about 800 ml E, from about 200 grams to about 250 grams P, about 200 ml to about 250 ml of W and a diazine or its derivative in the amount of about the molar equivalent of 5 g pyrazine/l E to about 10 g pyrazine/l E. This F etch is usable in the temperature range of from about 100° C. to about 119° C. Below this temperature range it loses its immunity to residue formation.

A preferred F etch is comprised of 750 ml E, 240 g P, 240 ml W and 6 g/l E of pyrazine. The etch rate for (100) silicon at 115° C. in the above solution is about 81 μm/hr.

It was a further desire to obtain an etch solution which is oxygen resistant and free from residue formation and usable at temperatures from about room temperature and up to about the boiling temperature of the solution and which etch at a slower rate than the above F etch for the etching of thin films or very shallow structures. It was discovered that this could be achieved by decreasing the water content of the EPW bath having a diazine concentration in excess of the molar equivalent of 4–5g pyrazine/lE. Experiments were conducted in which the diazine, i.e., pyrazine was held constant at 6 g/lE and the ratio of E and P maintained at 750 ml E: 120 g P, while varying W content.

Figure 2:
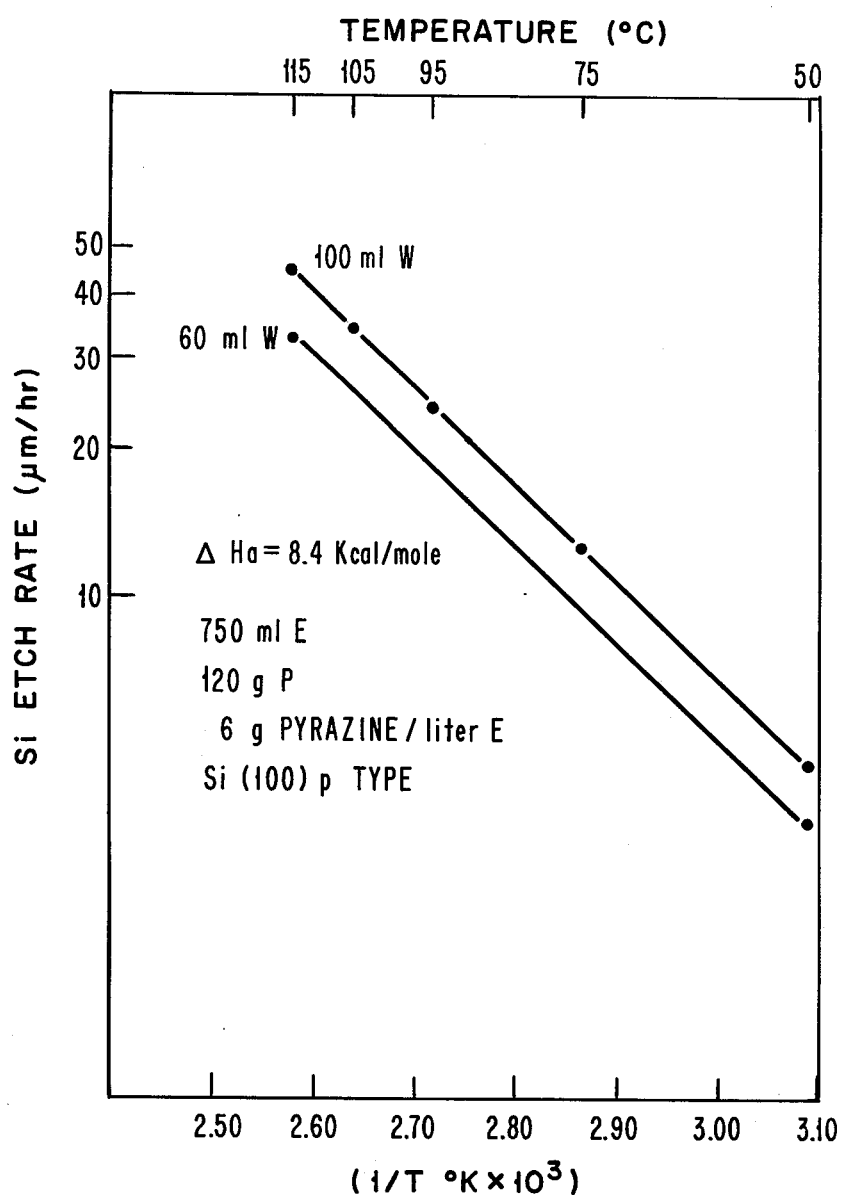
FIG. 2 depicts the temperature dependencies of the S baths at two different water concentrations.

FIG. 1 shows the variation of etch rate of (100) silicon surfaces in such solutions at different temperatures as a function of water content, while FIG. 2 shows the temperature dependencies of baths containing two different water concentrations. From FIGS. 1 and 2 it is seen that as the water content is reduced, the etch rate decreases. Furthermore, the tendency for residue formation was also observed to decrease with a decrease in water content. It is seen also that the activation energy for etching ($\Delta H_a$) remains constant with change in water content. Thus, in a preferred bath containing 6 g pyrazine/liter E, 750 ml E, 120 g P, 100 ml W, "S" etch, there was no evidence of residue formation down to 50° C. following etching of (100) silicon wafers for one hour. Similarly, at even lower water contents, down to 60 ml H₂O, no residue was observed. In a bath containing 120 ml H₂O with E, P and pyrazine kept at the same concentration as above, residues were however, observed at 50° C.

From FIG. 2 one can derive an equation which would enable one to determine etch rates at temperature below 50° C. For example, the derived equation is stated as $$\log R = \frac{-8.4 \times 10^3}{4.576T} + 6.375$$

where
R = etch rate in μm/hour and
T = etch temperature °K.

For example if one wants to determine etch rate at 20° C.

$$T = 273.2 + 20.0 = 293.2° \text{ K.}$$

$$\log R = \frac{-8.4 \times 10^3}{4.576 \times 293.2} + 6.375$$
$$\log R = \frac{-8.4 \times 10^3}{1342} + 6.375$$
$$= -6.25 + 6.375$$

log R = 0.116
R = 1.3 μm/hr.

The primary motivation for developing an etchant usable at low temperatures is to decrease the Si etch rate in order to achieve a more controlled etching of thin films (on the order of 1 μm or less), of either single crystal silicon, or polycrystalline silicon without incurring problems of residue formation. It is necessary, for adequate, control of etching, to decrease the etching rate so that etching times would be of the order of 4 to 5 minutes instead of 20 to 30 seconds.

"S" etch provides such a time range for approximately 0.4 μm thick films at 50° C. From FIG. 2 it is seen that "S" etch removal rates on single crystal (100) silicon can be varied from about 4.5 μm/hour-45 μm/hour in the interval 50°-115° C. respectively.

At 50° C. the preferred "S" etch composition etches polycrystalline silicon at about 6 μm/hour. In addition, "S" etch is highly resistant to exposure to air when used in an open beaker at 50° C. In extreme cases, when pure oxygen is bubbled directly through the solution for an hour very little change in etch rate is observed. Upon long term exposure to air (direct contact of air with the solution interface), the solution turns red then black, but the etch rate is unaffected significantly.

Figure 3:
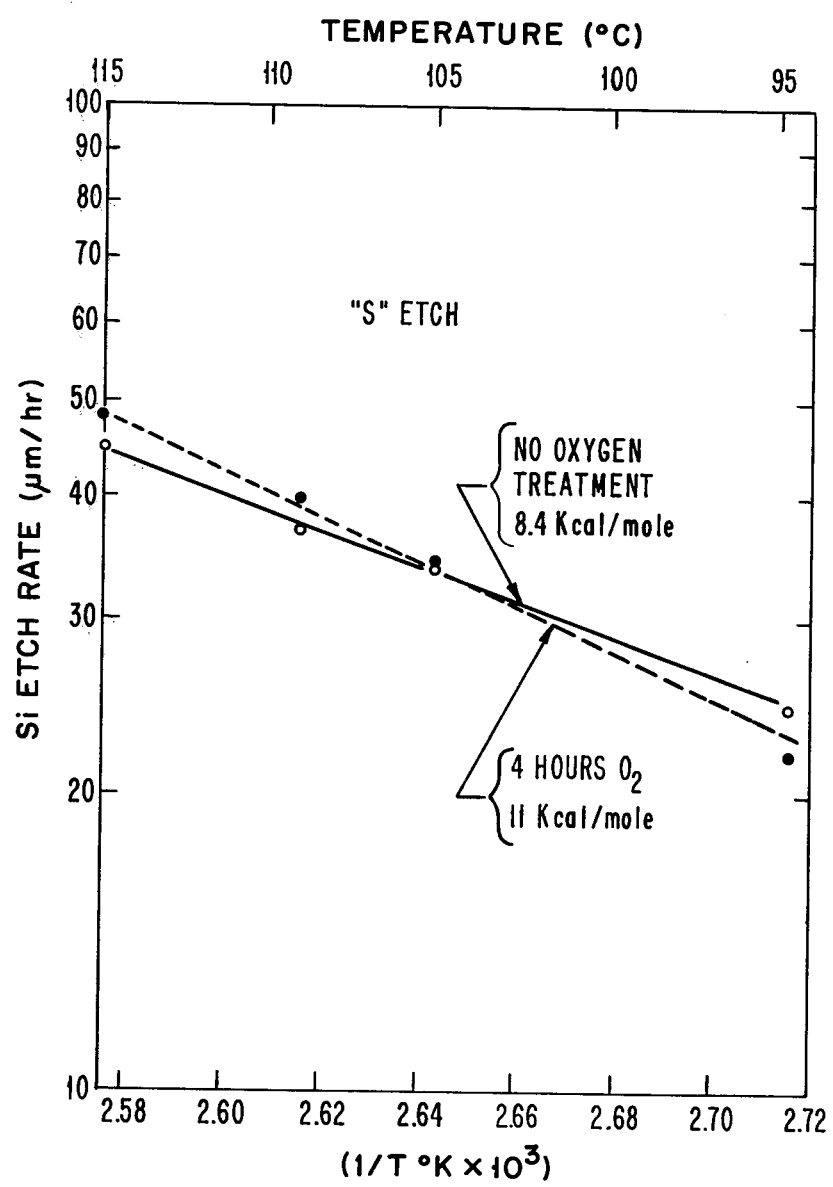
FIG. 3 depicts the temperature-etch rate relationship of a S bath composition of the invention treated with oxygen for four hours as compared to a non-oxygen treated bath.

An interesting aspect of the above is a comparison of the temperature-etch rate data for "S" etch treated with oxygen for four hours, and for the case where it was not, FIG. 3. It is seen that exposure to pure bubbled oxygen for these very long times causes an increase in the activation energy of the etching reaction back toward the original value observed without diazine present in EPW etch. What is most interesting is that the two curves intersect at 105° C. which means that if "S" etch is used at 105° C., it should be oxygen resistant indefinitely, i.e., it is essentially thermodynamically stable. At lower or higher temperatures, the oxygen resistance is from a practical point of view a kinetic question. At the lower temperatures, where the reaction rate of the solution with oxygen is slow, the oxygen effect is for all practical purposes nonexistent, while at the higher temperatures, the question would relate to the rate of interfacial reaction between air, containing 20% of oxygen and the solution surface. Presumably, similar crossover points should exist at each different water concentration.

At 75° C. and lower, the behavior depicted in FIG. 3, changes discontinuously, i.e., if oxygen is bubbled through "S" etch at either 75° C. or 50° C. for four hours, the etch rate at that temperature drops to zero. If these zero etch rate solutions are heated to 95° C. or higher for a few minutes, and the etch rate is remeasured at any temperature in the interval 50° C.-115° C., it returns to the same value it would have had in an oxygen untreated "S" etch solution. This indicates that when oxygen is bubbled through the solution at temperatures below 95° C. it makes the etchant inactive, but that this effect is eliminated by raising the temperature to 95° C. or above briefly. From a practical point of view, as before, simple exposure to air, as opposed to bubbling with pure oxygen, does not reveal this behavior. While the discontinuity at 95° C. cannot be discerned from FIG. 3, the interesting situation arises that in "S" etch, because of the intersection of the two curves, the effect of oxygen at temperatures above the intersection is to cause an increase in etch rate and at temperatures below the crossover point the effect of such exposure is to decrease the etch rate. It should be noted that in the etching of polycrystalline silicon films with the S etch, a haze or decrease in the reflectance of the film is developed when quenching of the etch is attempted by the use of cold water. To avoid this haze formation it is found necessary to first quench the etched polycrystalline silicon in hot water for a short period, e.g., 10-20 seconds, and then flush with cold water for about 2 minutes. This haze formation is not observed however, where S etch is used for etching single crystal silicon. In this case quenching can be accomplished in cold water alone without haze formation.

The "S" etch can be obtained by preparing solutions comprising from about 700 ml to about 800 ml E, from about 110 g to about 130 g P from about 40 ml to about 100 ml W and from the amount of about the molar equivalent of about 5 g pyrazine/lE to about 10 g pyrazine/lE of a diazine or its derivatives.

The preferred diazines and their derivatives found to be useful in the etch solutions of this invention include 1,2 diazine, 1,4 diazine, phthalazines pyridopyrazine, phenazine, 2,5 dimethylpyrazine, 2,6 dimethylpyrazine, tetramethylpyrazine and phenylpyrazine.

Thus, two oxygen and residue resistant diazine or its derivatives catalyzed ethylenediamine, pyrocatechol, water solutions have been developed which may be employed practically to etch single crystal and polycrystalline silicon, one of which (S etch) is useful as a controlled moderate rate solution in the temperature range form 20° C.-119° C. The other, F etch, provides rapid etching in the temperature range between 100° C. to 119° C. The preferred "F" etch contains 6 g pyrazine/liter E, 750 ml E, 240 g P, 240 ml W and provides the highest etch rate of about 81 μm/hr. It is highly residue and oxidation resistant at temperatures between 100° C. and 119° C. The preferred "S" etch containing 6 g pyrazine/liter E, 750 ml E, 120 g P, 100 ml W exhibits a somewhat decreased etch rate at 115° C. (45 μm/hour), but is useable as a residue and oxidation resistant etchant from 119° C. down to at least 50° C. (4.5 μm/hour), and is particularly suitable therefore for etching thin films of silicon where a high degree of etch rate control is desired or for chemically milling shallow structures in single crystal silicon.

There has been demonstrated above an improved method for etching silicon, and improved residue and oxidation resistant etching solutions therefore. Advantages accruing to this invention in addition to obtaining residue free surfaces and oxidation resistant etchants, include the ability to effectuate wide variations in etch rate by changing the water and/or pyrocatechol concentrations of the etchant and the ability to etch in the temperature range of from about 20° C. to about 119° C., in the presence of concentrations of diazine based catalysts on molar equivalent of 5 g pyrazine/lE or more.

Having thus described our invention, what we claim as new and desire to secure by Letters Patent is:

1. A residue and oxidation resistant etchant for the controlled etching of thin silicon films comprising;
   from about 700 ml to about 800 ml ethylenediamine, from about 110 g to about 130 g pyrocatechol, from about 40 ml to about 100 ml of water and a diazine or a derivative thereof in the amount of about the molar equivalent to from about 5 g pyrazine/l to about 10 g pyrazine/l ethylene diamine said etchant being operable in a temperature range of from about 20° C. to about 119° C.

2. The residue and oxidation resistant etchant of claim 1 wherein said diazine or its derivative is selected from the group consisting of 1, 4 diazine, phthalazine, pyridopyrazine, phenazine, 2,5 dimethylpyrazine, 2,6 dimethylpyrazine, tetramethylpyrazine and phenylpyrazine.

3. The residue and oxidation resistant etchant of claim 2 wherein said etchant is operable in a preferred temperature in the range from about 50° C. to about 115° C.

4. The residue and oxidation resistant etchant of claim 3 wherein said ethylenediamine is present in the amount of 750 ml, pyrocatechol in the amount of 120 grams, water in the amount of 100 ml and a diazine in the amount of about the molar equivalent of about 6 g pyrazine/l ethylenediamine.

5. The residue and oxidation resistant etchant of claim 4 wherein said diazine is pyrazine.

6. A method for the controlled etching of thin silicon films including the steps of:
   (a) Preparing an etch solution comprising from about 700 ml to about 800 ml ethylenediamine, from about 110 g to about 130 g pyrocatechol, from about 40 ml to about 100 ml of water and a diazine or a derivative thereof in the amount of about the molar equivalent of from about 5 g pyrazine/l to about 10 g pyrazine/l ethylene diamine
   (b) applying said etch solution to said silicon at a temperature range of from about 20° C. to about 119° C. and for a time sufficient to effect the desired etch pattern, and thereafter
   (c) quenching the etching of said silicon by the addition of water.

7. A method according to claim 6 wherein said diazine is selected from the group consisting of 1, 4 diazine, 1, 2 diazine, phthalazine, pyridopyrazine, phenazine, 2, 5 dimethylpyrazine, 2, 6 dimethylpyrazine, tetramethylpyrazine and phenylpyrazine.

8. A method according to claim 7 wherein said silicon is etched at a preferred temperature in the range of from about 50° C. to about 115° C.

9. A method according to claim 8 wherein said ethylenediamine is present in the amount of about 750 ml, pyrocatechol in the amount of 120 grams, water in the amount of 100 ml and a diazine in the amount of about the molar equivalent of about 6 g pyrazine/l ethylenediamine.

10. A method according to claim 9 wherein said silicon is polycrystalline and said etching is quenched by immersing said etched polycrystalline silicon in hot water for about 10 seconds to 20 seconds and thereafter flushing the same with cold water for about 2 minutes.

11. A residue and oxidation resistant fast etchant for etching silicon comprising;
   from about 700 ml to about 800 ml ethylenediamine, from about 200 g to about 250 g pyrocatechol, from about 200 ml to about 250 ml of water and a diazine or a derivative thereof in the amount of about the molar equivalent of from about 5 g pyrazine/l to about 10 g pyrazine/l ethylene diamine.

12. The fast etchant of claim 10 wherein said etchant is operable in a temperature range of from about 100° C. to about 119° C.

13. The fast etchant of claim 12 wherein said etchant is operable in a preferred temperature range of from about 100° C. to about 115° C.

14. The fast etchant of claim 13 wherein said pyrocatechol is present in an amount of about 240 grams.

15. The fast etchant of claim 14 wherein said ethylenediamine is present in the amount of 750 ml, pyrocatechol is present in the amount of about 240 g, water is present in the amount of about 240 ml and a diazine is present in the amount of about the molar equivalent of about 6 g pyrazine/l ethylenediamine.

16. The fast etchant of claim 15 wherein said etchant is operable at a temperature of 115° C.

17. A method for rapidly etching silicon films including the steps of:
   (a) preparing an etchant solution comprising from about 700 ml to about 800 ml ethylenediamine, from about 200 g to about 250 g pyrocatechol, from about 200 ml to about 250 ml of water and a diazine or a derivative thereof in the amount of about the molar equivalent of from about 5 g pyrazine/l to about 10 g pyrazine/l ethylenediamine
   (b) applying said etch solution to said silicon at a temperature range of from about 100° C. to about 119° C. and for a time sufficient to etch the desired amount of silicon
   (c) quenching the etching of said silicon by the addition of water.

18. A method according to claim 17 wherein said diazine is selected from the group consisting of 1,4 diazine, 1,2 diazine, phthalazine, pyridopyrazine, phenazine, 2,5 dimethylpyrazine, 2,6 dimethylpyrazine, tetramethylpyrazine and phenylpyrazine.

19. A method according to claim 18 wherein said silicon is etched at preferred temperature in the range of about 100° C. to about 115° C.

20. A method according to claim 19 wherein ethylenediamine is present in the amount of 750 ml, pyrocatechol is present in the amount of 240 grams, water is present in the amount of 240 ml and a diazine is present in the amount of about the molar equivalent of 6 g pyrazine/l ethylenediamine.

21. A method according to claim 20 wherein said etching is at a temperature of 115° C.

* * * * *